United States Patent [19]
Ishizuka

[11] Patent Number: 5,515,505
[45] Date of Patent: May 7, 1996

[54] SEMICONDUCTOR INTEGRATED CIRCUIT WITH BOUNDARY SCAN CIRCUIT

[75] Inventor: Satoshi Ishizuka, Tokyo, Japan

[73] Assignee: NEC Corporation, Tokyo, Japan

[21] Appl. No.: 334,224

[22] Filed: Nov. 4, 1994

[30]     Foreign Application Priority Data

Nov. 29, 1993   [JP]   Japan .................. 5-297962

[51] Int. Cl.$^6$ ................................... G06F 11/10
[52] U.S. Cl. .................. 395/183.06; 395/183.03
[58] Field of Search .................. 395/183.03, 183.06, 395/183.01

[56]             References Cited

U.S. PATENT DOCUMENTS

| 4,645,951 | 2/1987 | Uragami .................. 307/446 |
| 5,331,219 | 7/1994 | Nakamura et al. .......... 365/189 |

OTHER PUBLICATIONS by Don Mc Clean et al., "Nikkei Electronics", No. 488, Dec. 11, 1989, pp. 314–320.
by Peter Hansen et al., "Nikkei Electronics", No. 490, Jan. 8, 1990, pp. 302–307.
by Stephen Evanczuk, "Nikkei Electronics", No. 492, Feb. 5, 1990, pp. 245–251.

Primary Examiner—Vicent P. Canney
Attorney, Agent, or Firm—Young & Thompson

[57]              ABSTRACT

A semiconductor integrated circuit has a boundary scan circuit in which the number of level converters is reduced while ensuring the freedom of device design. The semiconductor integrated circuit includes a logic circuit, a plurality of input and output pins having different logic levels, a plurality of serially connected testing circuits connected between the logic circuit and the input and output pins, and a plurality of level converters for converting logic levels. The serially connected testing circuits include a first group of testing circuits having the same logic levels as those of the input and output pins connected thereto, the testing circuits of the first group being connected directly in series to each other, and a second group of testing circuits having logic levels different from those of the input and output pins connected thereto. The testing circuits of the second group are connected through the level converters.

3 Claims, 5 Drawing Sheets

SEMICONDUCTOR INTEGRATED CIRCUIT WITH BOUNDARY SCAN CIRCUIT

BACKGROUND OF THE INVENTION

1. Field of the Invention

The present invention relates to a semiconductor integrated circuit with a boundary scan circuit, and more particularly to a semiconductor integrated circuit with a boundary scan circuit composed of a logic circuit having different logic levels.

2. Description of the Related Art

One conventional boundary scan path (hereinafter referred to as "BSP") that has heretofore been implemented in a semiconductor integrated circuit will be described below with reference to FIG. 1 of the accompanying drawings.

In FIG. 1, an internal logic circuit 302 of a semiconductor integrated circuit has data input pins 305–308 and data output pins 309–312. A BSP includes testing circuits 313–320 including registers are connected in series between the data input pins 305–308 and data output pins 309–312. Data are inputted serially to a test data input pin 303 of the testing circuits 313–320, and parallel data produced from the inputted data are applied to the internal logic circuit 302, which is to be tested. Parallel data, indicative of the test results, are outputted serially from a test data output pin 304 of the testing circuits 313–320. In this manner, the semiconductor integrated circuit has been tested by the BSP. For further details, see "Nikkei Electronics" No. 488, pages 314 to 320, for example.

Another conventional BSP for a semiconductor device having a plurality of logic levels will be described below with reference to FIG. 2 of the accompanying drawings.

In FIG. 2, the semiconductor device has three logic levels, i.e., PECL, CMOS, GTL levels, and there are no limitations on the arrangement of pins due to the logic levels. The PECL level is the level of an ECL circuit that operates with a positive power supply, whereas ECL circuits normally operate with a negative power supply.

The semiconductor device shown in FIG. 2 has an internal logic circuit 402, data input pins 405–408, data output pins 409–412, a test data input pin 403, a test data output pin 404, and testing circuits 413–420 which are identical to the internal logic circuit 302, the data input pins 305–308, the data output pins 309–312, the test data input pin 303, the test data output pin 304, and the testing circuits 313–320. Inasmuch as the semiconductor device has three different logic levels and there are no limitations on the arrangement of pins due to the logic levels, as described above, level converters 421–427 for converting the levels are inserted in paths which connect the testing circuits 413–420 in series to each other.

With no limitations on the arrangement of pins due to the logic levels, the number "n" of inserted level converters is in the range of:

Number of level types $\leq$ n $\leq$ number of device pins, and hence depends on the number of level types of adjacent pins.

FIG. 3 of the accompanying drawings shows still another conventional BSP for a semiconductor device having three logic levels, i.e., PECL, CMOS, GTL levels, and limitations on the arrangement of pins due to the logic levels.

The conventional BSP shown in FIG. 3 is similar to the conventional BSP shown in FIG. 2 except that no level converters are inserted between the data input pins 405, 406 and also between the data output pins 418, 419 where the levels are the same.

With limitations on the arrangement of pins due to the logic levels, the number "n" of inserted level converters is in the range of:

(Number of level types) $-1 \leq n \leq$ (number of device pins) $-1$, and hence can be smaller. To reduce the number "n" of inserted level converters, however, it is necessary to position pins of the same level adjacent to each other.

In the semiconductor device with different logic levels and with no limitations on the arrangement of pins due to the logic levels, the number of level converters inserted in the BSP is very large, and may be equal to the number of pins at maximum. Consequently, the area taken up by the level converters is large, resulting in a large chip size.

In the semiconductor device with different logic levels and with limitations on the arrangement of pins due to the logic levels, the number of level converters inserted in the BSP may be smaller than that in the semiconductor device with no limitations on the arrangement of pins due to the logic levels. The more the limitations on the arrangement of pins due to the logic levels, the smaller the number of level converters inserted in the BSP.

However, the limitations on the arrangement of pins due to the logic levels greatly reduce the freedom of device design. In view of limitations on simultaneous operation needed by the positioning of pins of the same level adjacent to each other, it is necessary to further reduce the freedom of device design. Accordingly, the freedom of device design is limited though the chip size is not increased.

SUMMARY OF THE INVENTION

It is therefore an object of the present invention to provide a semiconductor integrated circuit with a boundary scan circuit having a reduced number of level converters without impairing the freedom of device design.

To achieve the above object, there is provided in accordance with the present invention a semiconductor integrated circuit with a boundary scan circuit, comprising a logic circuit, a plurality of input and output pins having different logic levels, a plurality of serially connected testing circuits connected between the logic circuit and the input and output pins, the serially connected testing circuits including a first group of testing circuits having the same logic levels as those of the input and output pins connected thereto, the testing circuits of the first group being connected directly in series to each other, and a second group of testing circuits having logic levels different from those of the input and output pins connected thereto, and a plurality of level converters for converting logic levels, the testing circuits of the second group being connected through the level converters.

The semiconductor integrated circuit with a boundary scan circuit may further include a wire interconnecting the testing circuits serially, the wire having a pattern of turns extending fully around the logic circuit, the level converters being connected respectively to terminal ends of the turns.

Alternatively, the semiconductor integrated circuit with a boundary scan circuit may further include a wire interconnecting the testing circuits serially, the wire having a pattern of folded lengths extending partly around the logic circuit, the level converters being connected respectively to terminal ends of the folded lengths.

Since the testing circuits of the first group are connected directly in series to each other, and a second group of testing circuits having logic levels different from those of the input and output pins connected thereto, and the testing circuits of the second group are connected through the level converters, the number of level converters required is minimized.

If the wire has a pattern of turns extending fully around the logic circuit, and the level converters are connected respectively to terminal ends of the turns, then since each of the turns has the same logic level, the pattern can easily be designed. If the wire has a pattern of folded lengths extending partly around the logic circuit and the level converters are connected respectively to terminal ends of the folded lengths, then the length of the wire is reduced. The latter arrangement is effective particularly where the types of input pin logic levels are different from the types of output pin logic levels and it is not necessary to have a wire extend fully around the logic circuit.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
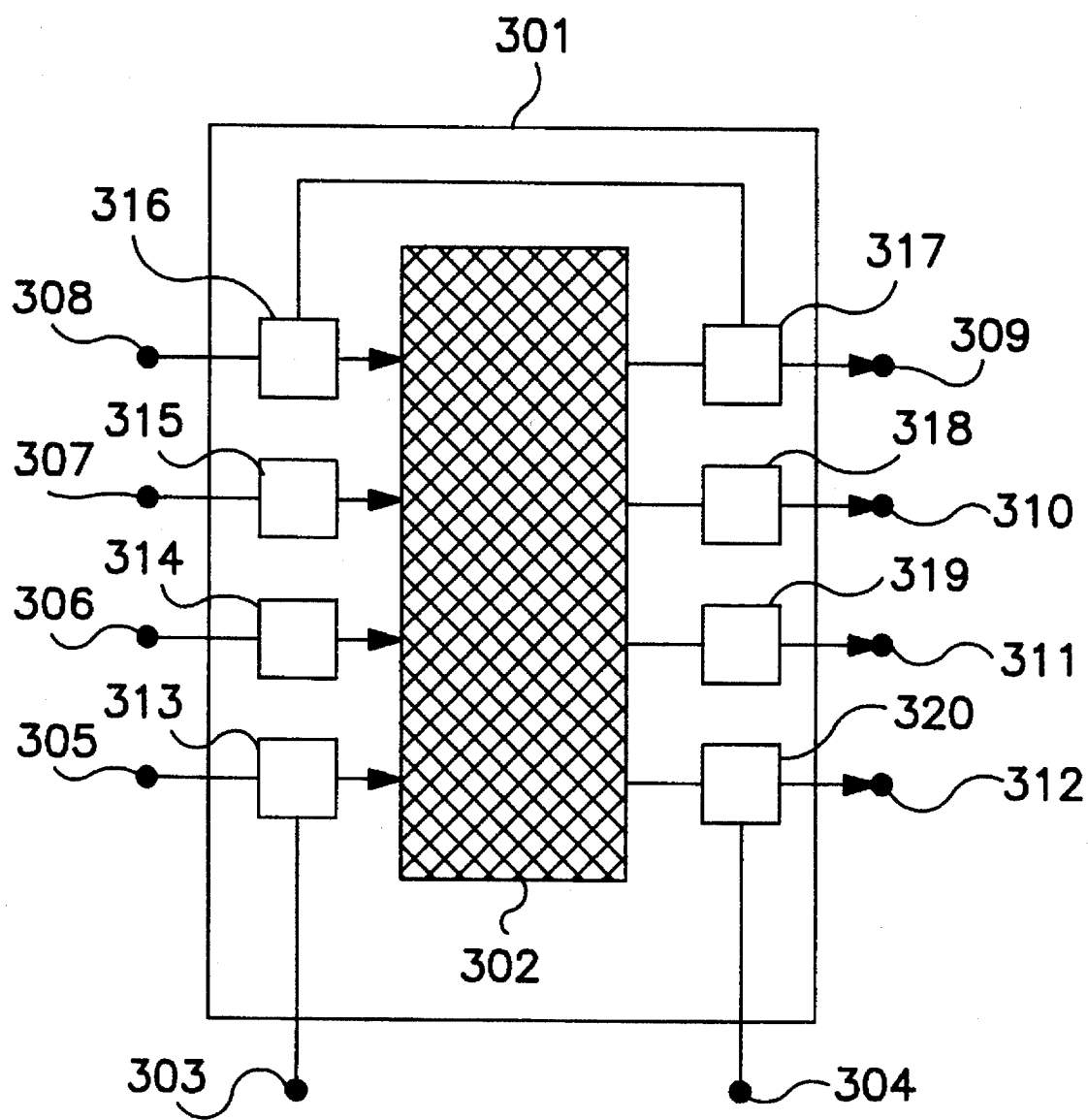
FIG. 1 is a circuit diagram of a conventional semiconductor integrated circuit with a boundary scan circuit.
Figure 2:
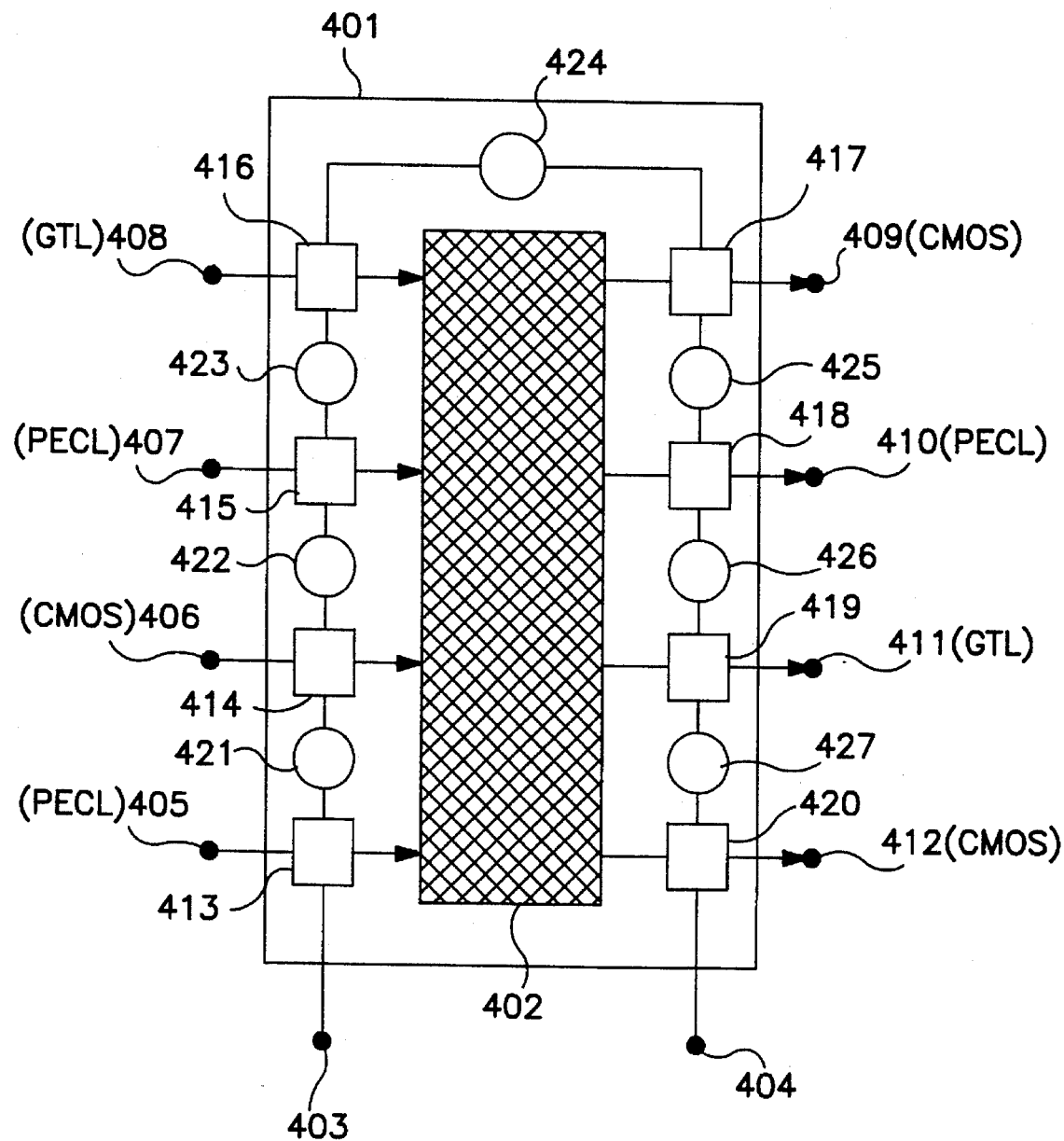
FIG. 2 is a circuit diagram of another conventional semiconductor integrated circuit with a boundary scan circuit.
Figure 3:
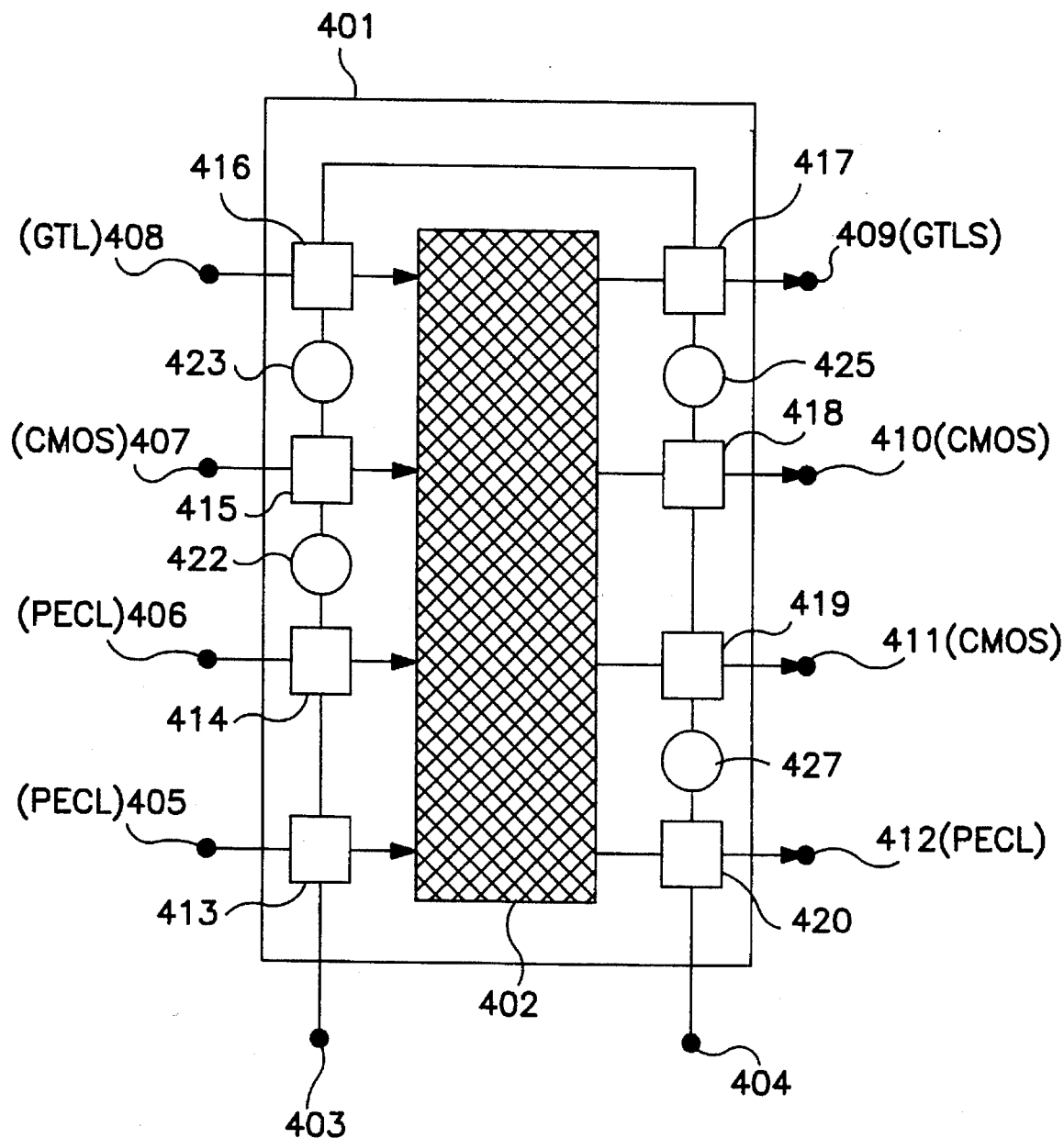
FIG. 3 is a circuit diagram of still another conventional semiconductor integrated circuit with a boundary scan circuit.
Figure 4:
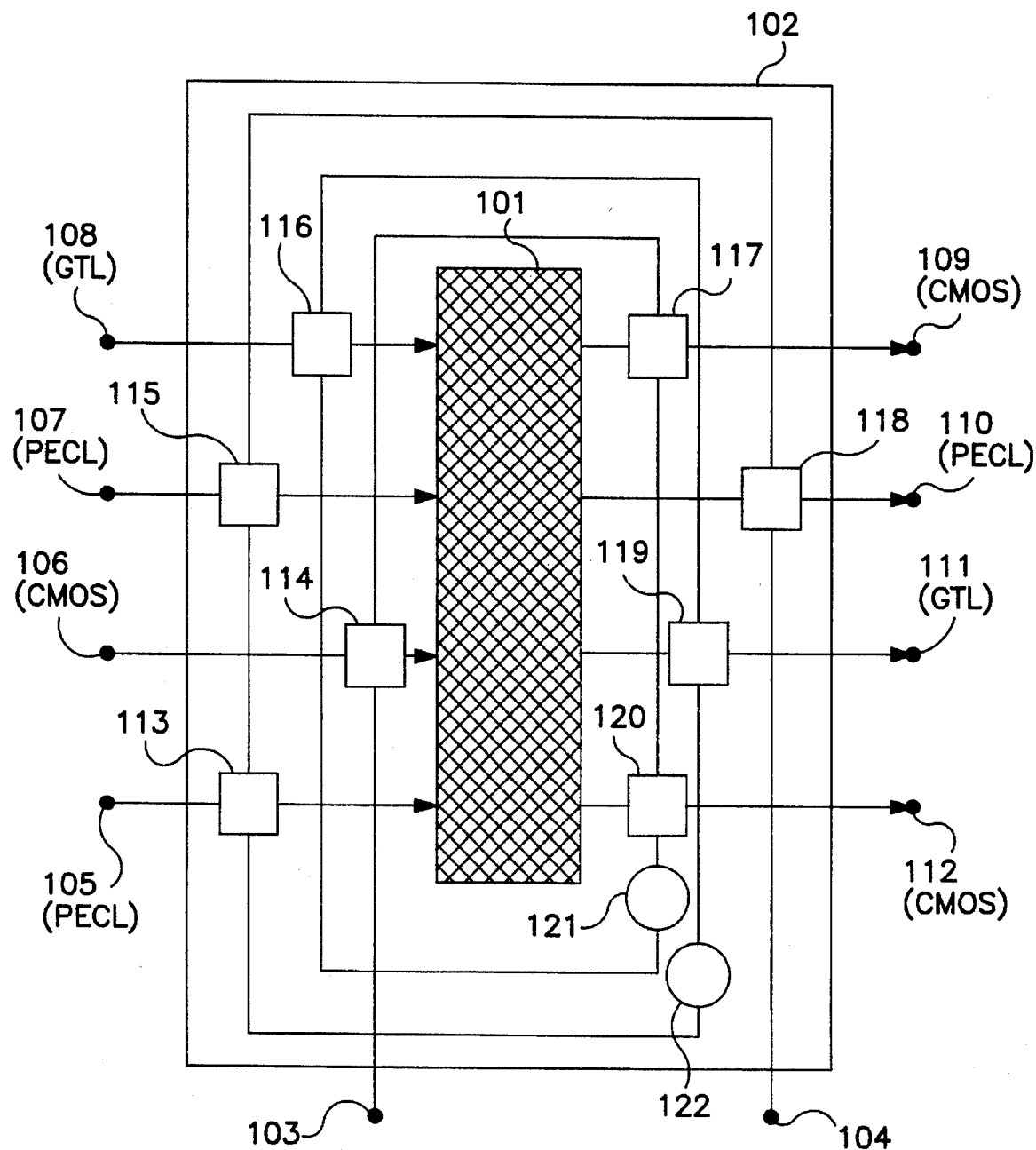
FIG. 4 is a circuit diagram of a semiconductor integrated circuit with a boundary scan circuit according to a first embodiment of the present invention.

FIG. 4 shows a semiconductor integrated circuit with a boundary scan circuit according to a first embodiment of the present invention.

As shown in FIG. 4, the semiconductor integrated circuit includes a package 102 having data input pins of three logic levels and data output pins of three logic levels.

Specifically, data input pins 105, 107 and a data output pin 110 have an interface of PECL level, a data input pin 106 and data output pins 109, 112 have an interface of CMOS level, and a data input pin 108 and a data output pin 111 have an interface of GTL level.

The data input and output pins are necessarily connected to an internal logic circuit 101 through testing circuits 113–120. The testing circuits 113–120 are connected serially on a BSP extending between a test data input pin 103 and a test data output pin 104.

The BSP has a wire or interconnection extending around the internal logic circuit 101 and having as many turns as the number of logic levels which exist in the package 102.

Since there are three logic levels, i.e., PECL, CMOS, and GTL levels, in the package 102 in this embodiment, the BSP has three turns extending around the internal logic circuit 101. The testing circuits 113–120 which have the same logic levels as the corresponding data input or output pins are connected to the turns of the BSP.

According to the first embodiment, the testing circuits 114, 117,120 which have a CMOS interface are connected to the first turn of the BSP which is closest to the internal logic circuit 101. The testing circuits 116, 119 which have a GTL interface are connected to the second turn of the BSP which is next to the first turn. The testing circuits 113, 115, 118 which have a PECL interface are connected to the third turn of the BSP which is farthest from the internal logic circuit 101. Level converters 1.21, 122 for converting signal levels into different interface levels are connected to respective boundaries between the first, second, and third turns of the BSP. The level converters 121, 122 serve to equalize the logic levels of the test data input pin 103 and the test data output pin 104.

The test data input pin 103 is of the CMOS level. The level converter 121 is connected to the terminal end of the first BSP turn for converting a signal from the CMOS level to the GTL level, and the level converter 122 is connected to the terminal end of the second BSP turn for converting a signal from the GTL level to the PECL level.

With the above BSP arrangement, the number of level converters which are installed is:

Number of logic levels present in the entire device −1. The number of level converters will be twice the above number if the logic levels are converted inversely. Therefore, the number of level converters which are required is much smaller than the number of level converters in the conventional BSP arrangements. It is not necessary to take into account limitations on the arrangement of pins due to the different logic levels.

In the first embodiment, as described above, the BSP incorporated in a semiconductor device having different logic levels has as many turns disposed around the internal logic circuit as the number of different logic levels. Because the number of level converters required is minimized, the chip size of the semiconductor integrated circuit can be reduced. The freedom of device design is not impaired as there are no limitations on the arrangement of pins due to the different logic levels.

Figure 5:
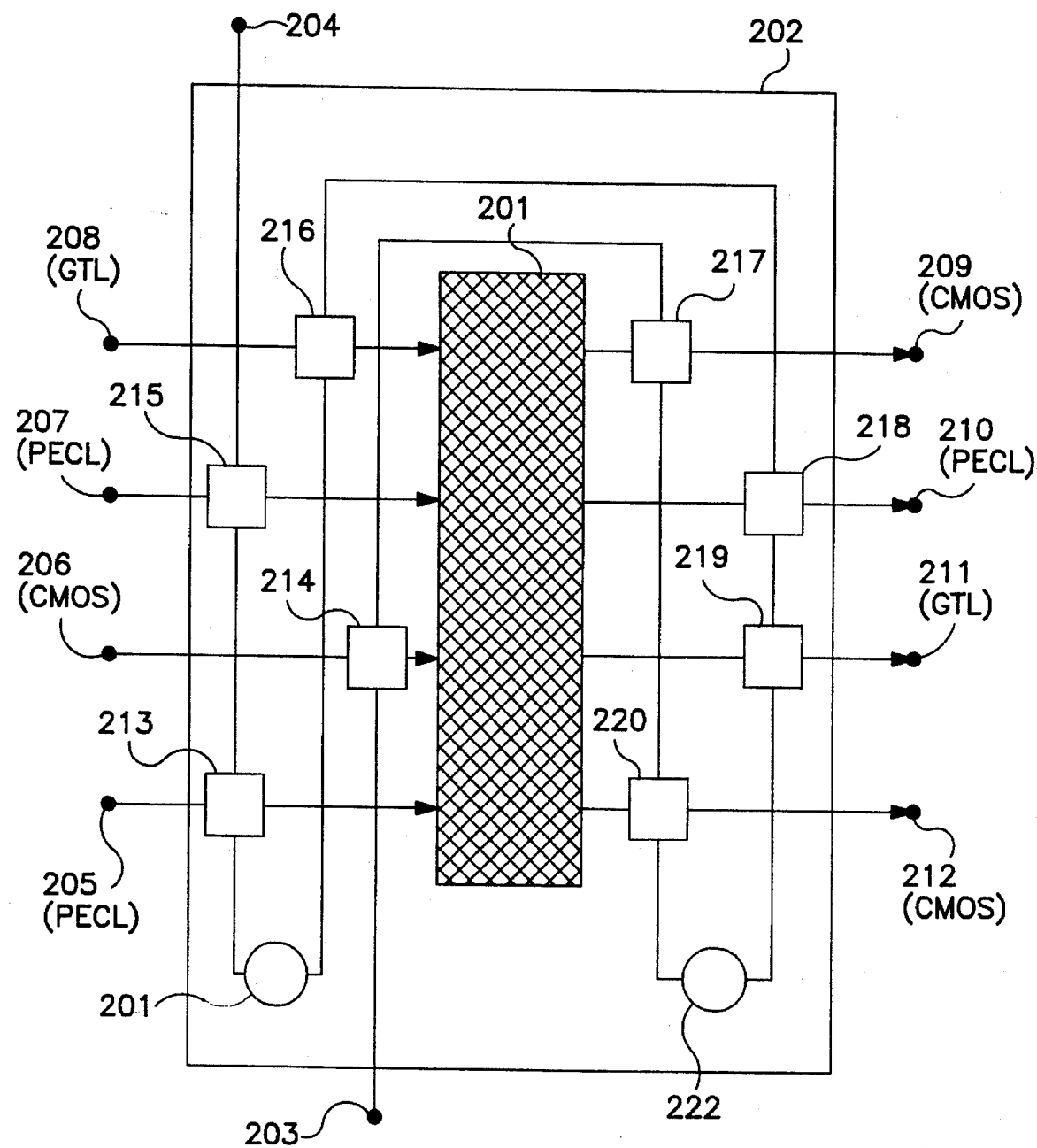
FIG. 5 is a circuit diagram of a semiconductor integrated circuit with a boundary scan circuit according to a second embodiment of the present invention.

FIG. 5 shows a semiconductor integrated circuit with a boundary scan circuit according to a second embodiment of the present invention.

In the case where pins are localized depending on the type of logic levels or a BSP may not fully surround an internal logic circuit in a device having different logic levels, the entire length of the BSP according to the first embodiment may be reduced.

As shown in FIG. 5, the semiconductor integrated circuit includes a package 202 having data input pins of three logic levels and data output pins of two logic levels.

Specifically, data input pins 205, 207 have an interface of PECL level, a data input pin 206 and data output pins 209, 212 have an interface of CMOS level, and a data input pin 208 and data output pins 210, 211 have an interface of GTL level.

A BSP according to the second embodiment has a first turn or length closest to the internal logic circuit 201 and connected to a test data input pin 203. To the first length of the BSP, there are connected testing circuits 214, 217, 220 having a CMOS interface which are arranged successively from the test data input pin 203, and a level converter 222 for converting a signal that has passed through the testing circuits 214, 217, 220 from the CMOS level into the GTL level.

Following the level converter 222, the BSP is folded back into a second turn or length around the internal logic circuit 201. To the second length of the BSP, there are connected testing circuits 219, 218, 216 having a GTL interface which are arranged successively from the level converter 222, and a level converter 221 for converting a signal that has passed through the testing circuits 219, 218, 216 from the GTL level into the PECL level.

Following the level converter 221, the BSP is folded back again into a length along the internal logic circuit 201. To this length, there are connected testing circuits 213, 215 having a PECL interface which are arranged successively from the level converter 221. A scan path signal that has passed through the testing circuits 213, 215 is outputted from a test data output pin 204.

In the second embodiment, as there are no device output pins with a PECL interface, the BSP can be connected to the test data output pin 204 following the testing circuit 215. The BSP does not surround the internal logic circuit 201 completely, but is folded back, and has a minimum length, the total length of the BSP is shorter than that of the BSP which is turned fully around the internal logic circuit as with the first embodiment described above.

Since the number of level converters required around the internal logic circuit is indicated by (the number of logic levels −1), and the BSP is of a folded structure, it is possible to minimize the number of level converters used and it is not necessary to limit the arrangement of device pins due to the BSP. Inasmuch as the total length of the BSP is shorter than that of the BSP of the first embodiment, the area occupied by the BSP is reduced, and the chip size of the semiconductor integrated circuit is also reduced.

The present invention as described above offers the following advantages:

In the case where a BSP is incorporated in a semiconductor integrated circuit having different logic levels, level converters, whose number is equal to (the number of logic levels −1), are disposed around an internal logic circuit, and the BSP is disposed in surrounding relationship to, or is of a folded structure around, the internal logic circuit. The number of level converters used is thus minimized. The effect of a reduced number of level converters is:

{the number of logic levels −1/the number of semiconductor integrated circuit pins} at maximum as compared with a device with no limitations on the arrangement of pins due to logic levels, and {the number of logic levels −1/(the number of semiconductor integrated circuit pins −1)} at maximum as compared with a device with limitations on the arrangement of pins due to logic levels. The greater the limitations on the arrangement of pins, the smaller the number of level converters used, but the greater the limitations on the freedom of device design. According to the present invention, no consideration at all should be given to limitations on the arrangement of pins.

Since it is possible to reduce the number of level converters used in the present invention, the chip size can be smaller than the conventional semiconductor integrated circuits, and hence the chip cost can be reduced. As no limitations are needed on the arrangement of pins, the freedom of device design is not impaired.

In addition, the freedom of device design can be increased according to the present invention.

If a BSP of folded structure is efficiently arranged, the area occupied by the BSP itself can be minimized.

Although certain preferred embodiments of the present invention has been shown and described in detail, it should be understood that various changes and modifications may be made therein without departing from the scope of the appended claims.

What is claimed is:

1. A semiconductor integrated circuit with a boundary scan circuit, comprising:

a logic circuit;

a plurality of input and output pins having different logic levels;

a plurality of serially connected testing circuits connected between said logic circuit and said input and output pins;

said serially connected testing circuits including a first group of testing circuits having the same logic levels as those of the input and output pins connected thereto, said testing circuits of the first group being connected directly in series to each other, and a second group of testing circuits having logic levels different from those of the input and output pins connected thereto; and a plurality of level converters for converting logic levels, said testing circuits of the second group being connected through said level converters.

2. A semiconductor integrated circuit with a boundary scan circuit according to claim 1, further comprising a wire interconnecting said testing circuits serially, said wire having a pattern of turns extending fully around said logic circuit, said level converters being connected respectively to terminal ends of said turns.

3. A semiconductor integrated circuit with a boundary scan circuit according to claim 1, further comprising a wire interconnecting said testing circuits serially, said wire having a pattern of folded lengths extending partly around said logic circuit, said level converters being connected respectively to terminal ends of said folded lengths.

* * * * *